United States Patent
Wang (10) Patent No.: US 8,232,820 B2
(45) Date of Patent: Jul. 31, 2012

(54) METHOD AND SOC FOR IMPLEMENTING TIME DIVISION MULTIPLEX OF PIN

(75) Inventor: Huigang Wang, Zhuhai (CN)

(73) Assignee: Actions Semiconductor Co., Ltd., Zhuhai, Guangdong (CN)

( * ) Notice: Subject to any disclaimer, the term of this patent is extended or adjusted under 35 U.S.C. 154(b) by 27 days.

(21) Appl. No.: 13/000,485

(22) PCT Filed: Jul. 30, 2009

(86) PCT No.: PCT/CN2009/073005
§ 371 (c)(1), (2), (4) Date: Dec. 21, 2010

(87) PCT Pub. No.: WO2010/012236
PCT Pub. Date: Feb. 4, 2010

(65) Prior Publication Data
US 2011/0102053 A1    May 5, 2011

(30) Foreign Application Priority Data
Jul. 31, 2008 (CN) .......................... 2008 1 0134905

(51) Int. Cl.
*H03K 17/16* (2006.01)
(52) U.S. Cl. ............... 326/30; 326/86; 326/82; 710/36; 710/105; 710/305
(58) Field of Classification Search .................. 326/82, 326/86, 30; 710/36, 105, 106, 305, 306, 710/310; 370/438, 439, 465, 514; 375/220, 375/368
See application file for complete search history.

(56) References Cited

U.S. PATENT DOCUMENTS

| | | | | |
|---|---|---|---|---|
| 5,602,848 A | * | 2/1997 | Andrews et al. | 370/465 |
| 7,096,303 B1 | * | 8/2006 | Caruk et al. | 710/306 |
| 7,983,308 B1 | * | 7/2011 | Johnston et al. | 370/514 |
| 7,991,296 B1 | * | 8/2011 | Johnston et al. | 398/154 |

FOREIGN PATENT DOCUMENTS

| | | |
|---|---|---|
| CN | 1503146 A | 6/2004 |
| CN | 1979685 A | 6/2007 |
| CN | 101329663 A | 12/2008 |

OTHER PUBLICATIONS

International Search Report: PCT/CN2009/073005.

* cited by examiner

*Primary Examiner* — Vibol Tan
(74) *Attorney, Agent, or Firm* — Ladas & Parry LLP (57) ABSTRACT

A method for using pins in different mode during different time is provided. The method is able to make at least one pin of a SOC be used in a first interface mode or a second interface mode during different time; wherein the SOC comprises a first interface circuit, a first pin, a second interface circuit, and a second pin; the first interface circuit comprises a first bidirectional PAD unit, a first signal interface unit of the first interface mode and a interface unit of the second interface mode; the second interface circuit comprises a second bidirectional PAD unit, a second signal interface unit of the first interface mode. The method comprises: selecting the output of the first signal interface unit or the output of the interface unit of the second interface mode to be connected with the first pin through the first bidirectional PAD unit during different time.

14 Claims, 5 Drawing Sheets

Fig. 9

METHOD AND SOC FOR IMPLEMENTING TIME DIVISION MULTIPLEX OF PIN

FIELD OF THE INVENTION

The present invention relates to data transmission technologies of a System-On-a-Chip (SOC), and more particularly, to a method and SOC for using pins in different modes during different time.

BACKGROUND OF THE INVENTION

At present, many SOCs support an Inter-Integrated Circuit (I2C) bus interface and a General Purpose Input/Output (GPIO) interface at the same time. The I2C bus interface adopts an I2C bus data transmission protocol, and is a serial bus interface consisting of a Serial Clock (SCL) interface and a Serial Data (SDA) interface. The I2C bus interface transmits data between integrate circuits, and is implemented by using two pins of the SOC. The GPIO interface is usually used to transmit some simple control logic from the SOC to external devices or transmit some simple state from the external devices to the SOC, e.g. a chip selecting signal for external storage devices, and an enable signal for external display devices, etc., and the GPIO interface usually is implemented by using one pin.

Figure 1:
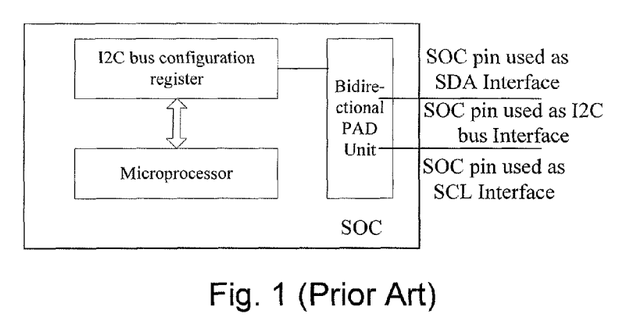
FIG. 1 is a schematic diagram illustrating a structure of implementing an I2C bus interface in a SOC in the prior art.

When the I2C bus interface is implemented in the SOC, as shown in FIG. 1, a microprocessor, an I2C bus configuration register and a bidirectional PAD unit are included in the SOC. The microprocessor controls the I2C bus configuration register to perform I2C bus configuration on interfaces through the bidirectional PAD unit and transmit data. There is a pull-up resistor complying with the I2C bus protocol in the bidirectional PAD unit.

Figure 2:
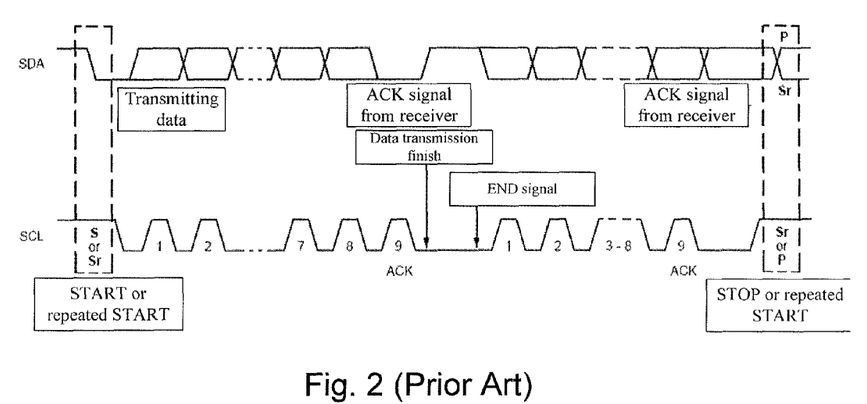
FIG. 2 is a sequence chart of an I2C bus protocol in the prior art.

Specifically, the I2C bus interface may be configured according to the I2C bus protocol, and a sequence chart of the I2C bus protocol is shown in FIG. 2. As can be seen, there are three pieces of state information in data transmission process of the I2C bus to characterize the transmission process, which respectively are transmission START, transmission END and one byte transmission finish, and the three pieces of state information are implemented by cooperation of the SCL and SDA in the I2C bus. For the state information of the transmission START, when the SCL is at high level and the SDA jumps from high level to low level, data transmission starts; for the state information of the transmission END, when the SCL is at high level and the SDA jumps from low level to high level, data transmission ends; for an acknowledgement signal (ACK), after receiving 8 bits of data, an integrated circuit (IC) for receiving data sends a specific low level pulse to an IC for sending data to indicate that the data is received.

Figure 3:
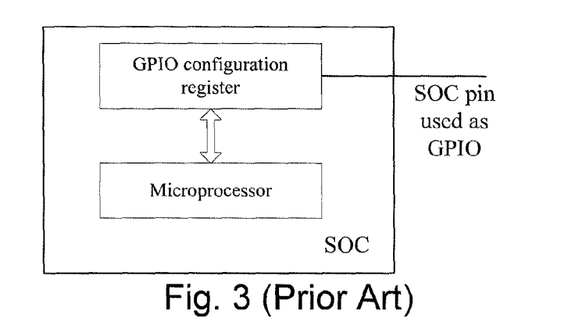
FIG. 3 is a schematic diagram illustrating a structure of implementing a GPIO in a SOC in the prior art.

When the GPIO is implemented in the SOC, as shown in FIG. 3, a microprocessor, a GPIO configuration register are included in the SOC. The microprocessor controls the GPIO configuration register to configure an interface as a GPIO interface, and then data is transmitted through high level or low level.

Generally, different pins in the SOC are used to implement the I2C bus interface and the GPIO interface, thus the number of the interface pins in the SOC is large, and complexity and cost of the SOC applications are high.

SUMMARY OF THE INVENTION

One embodiment of the present invention provides a SOC which can save pins. In the SOC, at least one pin is used in a first interface mode or a second interface mode during different time. The SOC comprises a first interface circuit, a first pin, a second interface circuit and a second pin.

The first interface circuit comprises a first bidirectional PAD unit, a first signal interface unit of the first interface mode, an output port of the first bidirectional PAD unit is connected with the first pin.

The second interface circuit comprises a second bidirectional PAD unit, a second signal interface unit of the first interface mode, and the second signal interface unit of the first interface mode is connected with the second pin through the second bidirectional PAD unit.

The first interface circuit further comprises a selecting unit and an interface unit of the second interface mode; the selecting unit is used to select an output of the first signal interface unit of the first interface mode or an output of the interface unit of the second interface mode during different time, and the selected output is connected with an input port of the first bidirectional PAD unit.

Another embodiment of the present invention provides a method for using pins in different modes during different time, being able to make at least one pin of a System-On-a-Chip (SOC) be used in a first interface mode or a second interface mode during different time. The SOC comprises a first interface circuit, a first pin, a second interface circuit, and a second pin; the first interface circuit comprises a first bidirectional PAD unit, a first signal interface unit of the first interface mode and a interface unit of the second interface mode; the second interface circuit comprises a second bidirectional PAD unit, a second signal interface unit of the first interface mode; and the method includes: connecting an output of the first signal interface unit of the first interface mode or an output of the interface unit of the second interface mode with the first pin through the first bidirectional PAD unit during different time.

In the embodiments of the present invention, pins are used in different interface modes during different time, thereby pins resources of the SOC can be saved.

DETAILED DESCRIPTION OF THE INVENTION

In order to make the purpose, solutions and merit clearer, the present invention is illustrated in detail hereinafter with reference to the accompanying drawings and specific embodiment.

Figure 4:
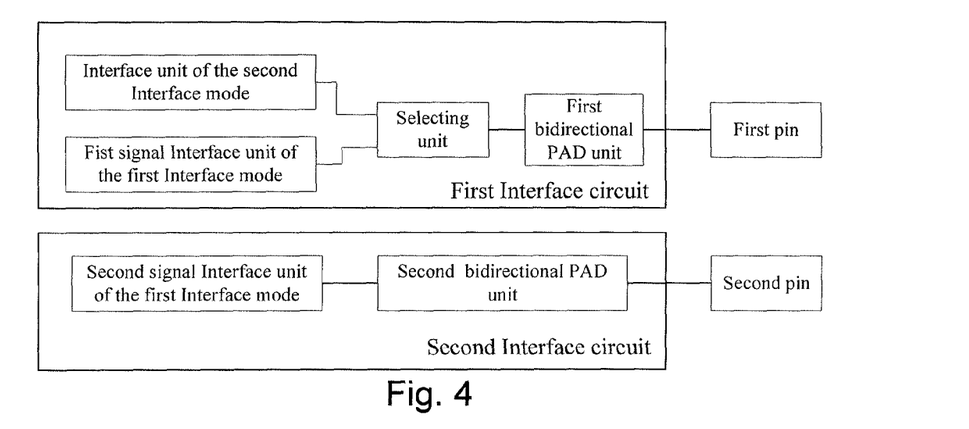
FIG. 4 is a schematic diagram illustrating a structure of an SOC according to an embodiment of the present invention.

FIG. 4 shows a SOC in an embodiment of the present invention. In the SOC, at least one pin can be used in a first interface mode or a second interface mode during different time. The SOC includes a first interface circuit, a second interface circuit, a first pin and a second pin.

The first interface circuit includes a first bidirectional PAD unit, a first signal interface unit of the first interface mode, and an output port of the first bidirectional PAD unit is connected with the first pin.

The second interface circuit includes a second bidirectional PAD unit, a second signal interface unit of the first interface mode. The second signal interface unit of the first interface mode is connected with the second pin through the second bidirectional PAD unit.

The first interface circuit further includes a selecting unit and an interface unit of the second interface mode. The selecting unit is used to select an output of the first signal interface unit of the first interface mode or an output of the interface unit of the second interface mode in a time-division manner, and the selected output is connected to an input port of the first bidirectional PAD unit.

In the embodiments of the present invention, the output of the interface unit refers to a connection end connected with the bidirectional PAD unit in the interface unit, which may include the output of a signal output unit or the input of a signal input unit. The input port of the bidirectional PAD unit refers to a port connected with an internal circuit of a chip, and the output port refers to a port connected with pins of the chip.

According to the embodiments of the present invention, in one application of the SOC, the pins may be used in two different interface modes during different time. Detailed descriptions are provided by taking it for example that the pins of the SOC are used in a GPIO interface mode or an I2C bus interface mode during different time.

The I2C bus interface is implemented by using two SOC pins, i.e. a pin for transmitting a SDA signal and a pin for transmitting a SCL signal. The GPIO interface is implemented by using one SOC pin. Hence, in the embodiments of the present invention, the pin for transmitting the SDA signal may be used in the GPIO interface mode, or the pin for transmitting the SCL signal may be used in the GPIO interface mode.

Figure 5:
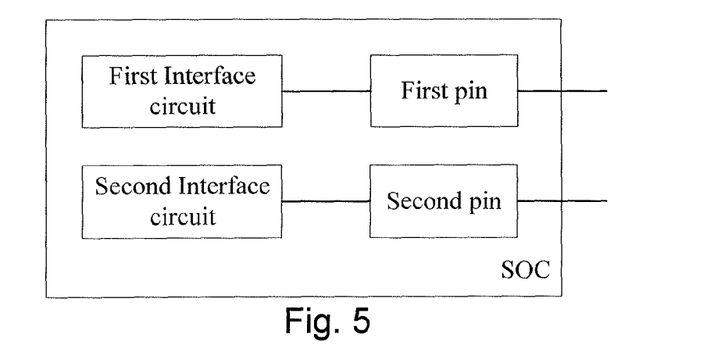
FIG. 5 is a schematic diagram illustrating a structure of an SOC according to another embodiment of the present invention.

Referring to FIG. 5, a SOC of an embodiment of the present invention includes a first interface circuit, a second interface circuit, a first pin connected with the first interface circuit, and a second pin connected with the second interface circuit.

Figure 6:
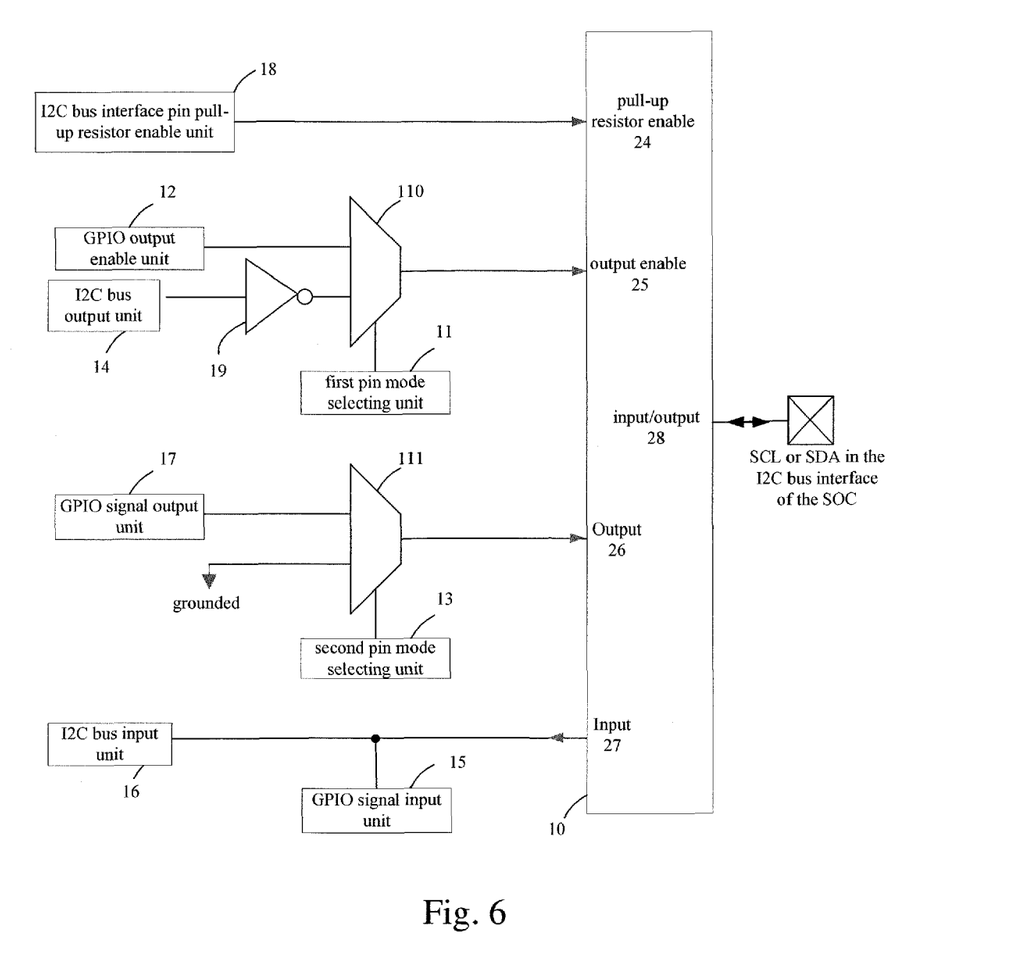
FIG. 6 is a schematic diagram illustrating a structure of a circuit whose pins having an I2C bus interface mode are used in a GPIO interface mode in an SOC according to an embodiment of the present invention.
Figure 7:
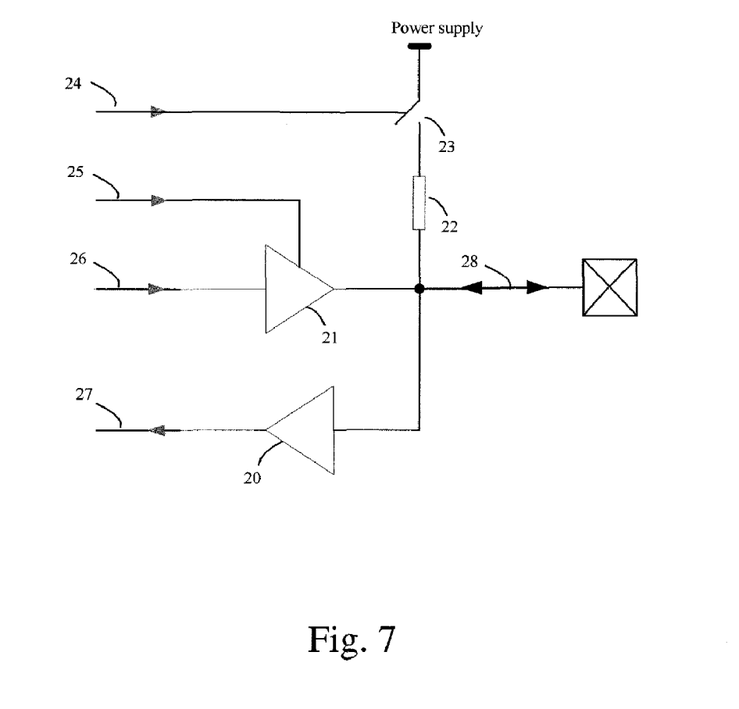
FIG. 7 is a schematic diagram illustrating a structure of a bidirectional PAD unit shown in FIG. 6 according to an embodiment of the present invention.

In the SOC of the first embodiment of the present invention, the first interface circuit and the second interface circuit both have a structure shown in FIG. 6 and a structure shown in FIG. 7. Each of the first and second interface circuits includes:

a bidirectional PAD unit 10, a first selector 110, a second selector 111, a GPIO output enable unit 12, a first pin mode selecting unit 11, a second pin mode selecting unit 13, an I2C bus output unit 14, a GPIO signal input unit 15, an I2C bus input unit 16, a GPIO signal output unit 17, an I2C bus interface pin pull-up resistor enable unit 18 and a reverser 19.

In the first interface circuit, the I2C bus output unit 14 is a SDA signal output unit, the I2C bus input unit 16 is a SDA signal input unit.

In the second interface circuit, the I2C bus output unit 14 is a SCL signal output unit, the I2C bus input unit 16 is a SCL signal input unit.

The bidirectional PDA unit 10 includes a first port 24, a second port 25, a third port 26, a fourth port 27 and a fifth port 28, and the first port to the fourth port are input ports, and the fifth port is an output port.

The output of the GPIO output enable unit 12 is connected with one input of the first selector 110, the output of the I2C bus output unit 14 is connected with the other input of the first selector 110 after inversed by the reverser 19; the output of the first selector 110 is connected with the second port 25 of the bidirectional PAD unit 10, and the control port of the first selector 110 is connected with the first pin mode selecting unit 11.

The output of the GPIO signal output unit 17 is connected with one input of the second selector 111, the other input of the second selector 111 is grounded, the output of the second selector 111 is connected with the third port 26 of the bidirectional PAD unit 10, and the control port of the second selector 111 is connected with the second pin mode selecting unit 13.

The input of the I2C bus input unit 16 and the input of the GPIO signal input unit 15 are both connected with the fourth port 27 of the bidirectional PAD unit 10.

The output of the I2C bus interface pin pull-up resistor enable unit 18 is connected with the first port 24 of the bidirectional PAD unit 10.

The bidirectional PDA unit 10 further includes a buffer 20, a three-state buffer 21, a pull-up resistor 22 and a switch 23. The input of the buffer 20 is connected with the fifth port 28, and the output of the buffer 20 is connected with the fourth port 27; the input of the three-state buffer 21 is connected with the third port 26, the control port of the three-state buffer 21 is connected with the second port 25, the output of the three-state buffer 21 is connected with the fifth port 28; one side of the pull-up resistor 22 is connected with the fifth port 28, the other side of the pull-up resistor 22 is connected with the output of the switch 23; the input of the switch 23 is connected with a power supply, the control port of the switch 23 is connected with the first port 24; the fifth port 28 is connected with a pin which is used as the SCL and/or SDA of the I2C bus interface in the SOC, or used as the GPIO mode.

The I2C bus interface pin pull-up resistor enable unit 18 is used to close or break the switch 23.

When the bidirectional PAD unit configures the pins in the I2C bus interface mode, the pull-up resistor works, i.e. is connected with the power supply; when the pins are configured in the GPIO interface mode, the pull-up resistor does not work, i.e. breaks up with the power supply.

When the pins are configured in the I2C bus interface mode, the I2C bus interface pin pull-up resistor enable unit 18 outputs a signal to close the switch 23 and connect the pull-up resistor 22 with the power supply, so that the pull-up resistor 22 pulls the level of the fifth port 28 up, the first pin mode selecting unit 11 outputs a signal to control the first selector 110 output a signal through the reverser 19, the second pin mode selecting unit 13 outputs a signal to control the second selector 111 output a grounding signal. In this mode, when the I2C bus output unit 14 outputs a high level, the second port 25 is at low level, the three-state buffer 21 is stopped, the fifth port 28 is pulled up as high level by the pull-up resistor 22, in this way, the pins also outputs a high level; when the I2C bus output unit 14 outputs a low level, the second port 25 is at high level, the three-state buffer 21 sends the grounding signal output by the second selector 111 to the fifth port 28, in this way, the pins also outputs a low level, so as to implement the output function of the I2C. In addition, the input signals of the pins may also output to the I2C bus input unit 16 through the buffer 20, so as to implement the input function of the I2C.

When the pins are used in the GPIO interface mode, the I2C bus interface pin pull-up resistor enable unit 18 outputs a signal to break the switch 23, the first pin mode selecting unit 11 outputs a signal to control the first selector 110 to output an output signal of the GPIO output enable unit 12, the second pin mode selecting unit 13 outputs a signal to control the second selector 111 to output an output signal of the GPIO signal output unit 17. In this mode, when the GPIO output enable unit 12 outputs a high level, the second port 25 is at high level, the three-state buffer 21 sends the output signal of the GPIO signal output unit 17 output by the second selector 111 to the fifth port 28, and thus the pins output the output signal of the GPIO signal output unit 17, so as to implement the GPO function; when the GPIO output enable unit 12 outputs a low level, the second port 25 is at low level, the three-state buffer 21 is stopped, the input signal of the pins may be output to the GPIO signal input unit 15 through the buffer 20, so as to implement the GPI function.

In the embodiments of the present invention, the I2C bus interface pin pull-up resistor enable unit 18, the GPIO output enable unit 12, the I2C bus output unit 14, the GPIO signal input unit 15, the I2C bus input unit 16, the GPIO signal output unit 17, the first pin mode selecting unit 11 and the second pin mode selecting unit 13 may be implemented by a buffer, and the input signal of each unit may be provided by other inner circuit of the SOC.

For example, in specific implementing, the control signals of the I2C bus interface pin pull-up resistor enable unit 18, the first pin mode selecting unit 11, the second pin mode selecting unit 13 may be provided by the microprocessor inside the SOC.

Table 1 is a logic truth table of the bidirectional PAD unit 10.

TABLE 1

| Port 24 | Port 25 | Port 26 | Port 28 | Port 27 | remark |
|---------|---------|---------|---------|---------|--------|
| 0 | 0 | 0 | input | logic is the same as that of port 28 | GPI |
| 0 | 0 | 1 | input | logic is the same as that of port 28 | GPI |
| 0 | 1 | 0 | Output low level | logic is the same as that of port 28 | GPO |
| 0 | 1 | 1 | Output high level | logic is the same as that of port 28 | GPO |
| 1 | 0 | 0 | Pull up high level | logic is the same as that of port 28 | I2C bus interface |
| 1 | 0 | 1 | Pull up high level | logic is the same as that of port 28 | Should be avoided in application |
| 1 | 1 | 0 | Output low level | logic is the same as that of port 28 | I2C bus interface |
| 1 | 1 | 1 | Output high level | logic is the same as that of port 28 | Should be avoided in application |

In a SOC of the second embodiment of the present invention, a first interface circuit has the structure as shown in FIG. 6 and FIG. 7; the I2C bus input unit 16 is a SDA signal input unit; the I2C bus output unit is a SDA signal output unit, and a second interface circuit may be normal I2C bus interface circuit and corresponds to the SCL signal. In this embodiment, the first pin is used in the I2C bus interface mode or the GPIO interface mode during different time.

In a SOC of the third embodiment of the present invention, a first interface circuit has the structure as shown in FIG. 6 and FIG. 7, the I2C bus input unit 16 is a SCL signal input unit; the I2C bus output unit is a SCL signal output unit, and a second interface circuit may be normal I2C bus interface circuit and corresponds to the SDA signal. In this embodiment, the first pin is also used in the I2C bus interface mode or the GPIO interface mode during different time.

Embodiments of the method for implementing time division multiplex of pin, i.e. using pins in different modes during different time are also provided in the present invention.

In the method for using pins in different modes during different time in one embodiment of the present invention, at least one pin of a SOC is used in a first interface mode or a second interface mode at different time; the SOC includes a first interface circuit, a first pin, a second interface circuit and a second pin. The first interface circuit includes a first bidirectional PAD unit, a first signal interface unit of the first interface mode, and an interface unit of the second interface mode. The second interface circuit includes a second bidirectional PAD unit, a second signal interface unit of the first interface mode. The method includes:

connecting the output of the first signal interface unit of the first interface mode or the output of the interface unit of the second interface mode with the first pin through the first bidirectional PAD unit in a time-division manner.

Optionally, the first bidirectional PAD unit includes a pull-up resistor and a switch unit; one side of the pull-up resistor is connected with the first pin, the other side of the pull-up resistor is connected with a power supply through the switch unit. Connecting the output of the first signal interface unit of the first interface mode or the output of the interface unit of the second interface mode with the first pin through the first bidirectional PAD unit in a time-division manner includes performing one of SA and SB in a time-division manner.

SA, controlling the switch unit to be closed, and connecting the output of the first signal interface unit of the first interface mode with the first pin through the first bidirectional PAD.

SB, controlling the switch unit to be open, and connecting the output of the interface unit of the second interface mode with the first pin through the first bidirectional PAD.

Figure 8:
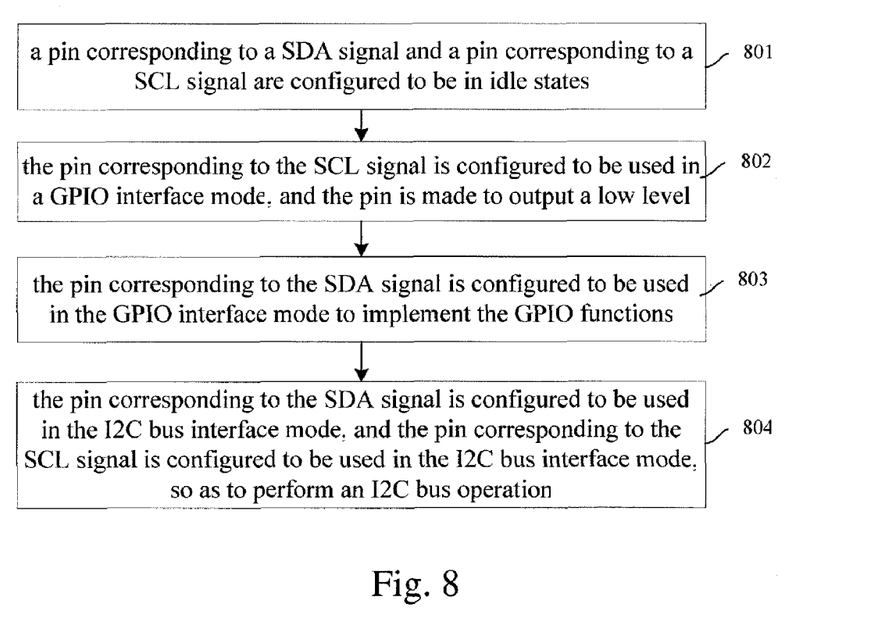
FIG. 8 is a flowchart illustrating a method for using SOC pins having an I2C bus interface mode in a GPIO interface mode according to an embodiment of the present invention.

FIG. 8 shows a flow chart illustrating a method for using SOC pins having an I2C bus interface mode in a GPIO interface mode provided by a fourth embodiment of the present invention. The SOC of the embodiment may have the characteristics of the SOC in the first embodiment of the present invention. The method includes the following steps.

Step 801, after configuring a pin corresponding to a SDA signal and a pin corresponding to a SCL signal to be used in an I2C bus interface mode according to a process of using the SOC pins as the I2C bus interface, the two pins are configured to be in idle states, i.e. a high level state.

Step 802, the SOC pin corresponding to the SCL signal is configured to be used in a GPIO interface mode according to a process of using the SOC pin as the GPIO interface, and the pin is made to output a low level.

Specifically, a following order may be adopted: making the GPIO signal output unit output a low level, making the GPIO output enable unit enable (i.e. selecting the GPO function), and making the I2C bus interface pin pull-up resistor enable unit un-enable (i.e. make the pull-up resistor break up with the power supply).

Step 803, the SOC pin corresponding to the SDA signal is configured to be used in the GPIO interface mode according to the process of using the SOC pin as the GPIO interface.

It is can be seen according to the I2C bus protocol sequence chart shown in FIG. 2, when the SOC pin corresponding to the SCL signal is at low level, the change between low level and high level of the SOC pin corresponding to the SDA signal will not cause a misacting of an I2C bus interface device. Therefore, when the SOC pin corresponding to the SCL signal is at low level, after the SOC pin corresponding to the SDA signal is configured to be used in the GPIO interface mode, the GPIO signal may be transmitted by using the pin corresponding to the SDA signal to implement the GPIO functions.

Step 804, after using the SOC pin corresponding to the SDA signal in the GPIO interface mode, the SOC pin is configured to be used in the I2C bus interface mode according to the process of using the SOC pin as the I2C bus interface, and the SOC pin corresponding to the SCL signal is configured to be used in the I2C bus interface mode, so as to perform a next I2C bus operation.

Figure 9:
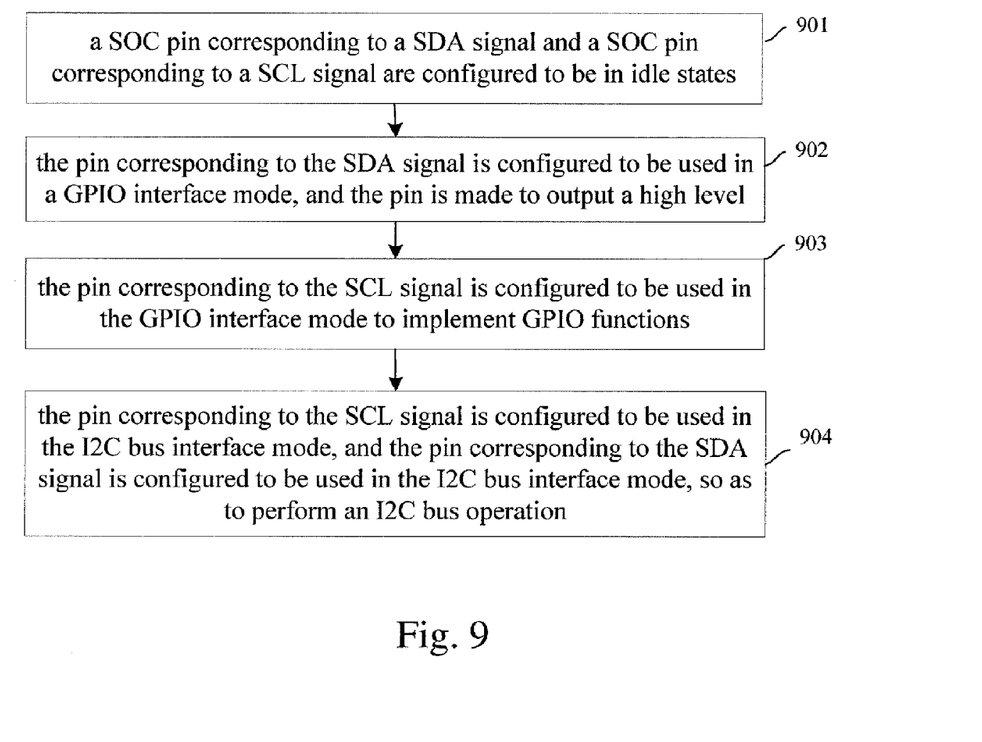
FIG. 9 is a flowchart illustrating a method for using SOC pins having an I2C bus interface mode in a GPIO interface mode according to another embodiment of the present invention.

FIG. 9 shows a flow chart illustrating a method for using SOC pins having an
I2C bus interface mode in a GPIO interface mode provided by a fifth embodiment of the present invention. The SOC of the embodiment may have the characteristics of the SOC in the first embodiment of the present invention. The method includes the following steps.

Step 901, after configuring a SOC pin corresponding to a SDA signal and a SOC pin corresponding to a SCL signal to be used in an I2C bus interface mode according to a process of using the SOC pins as the I2C bus interface, the two pins are configured to be in idle states, i.e. a high level state.

Step 902, the SOC pin corresponding to the SDA signal is configured to be used in a GPIO interface mode according to the process of using the SOC pin as the GPIO interface, and the SOC pin is made to output a high level.

Specifically, a following order may be adopted: making the GPIO signal output unit output a high level, making the GPIO output enable unit enable (i.e. selecting the GPO function), and making the I2C bus interface pin pull-up resistor enable unit enable (i.e. make the pull-up resistor be connected with the power supply).

Step 903, the SOC pin corresponding to the SCL signal is configured to be used in the GPIO interface mode according to the process of using the SOC pin as the GPIO interface.

It is can be seen according to the I2C bus protocol sequence chart shown in FIG. 2, when the SOC pin corresponding to the SDA signal is at high level, the change between low level and high level of the SOC pin corresponding to the SCL signal will not cause a misacting of an I2C bus interface device. Therefore, when the SOC pin corresponding to the SDA signal is at high level, after the SOC pin corresponding to the SCL signal is configured to be used in the GPIO interface mode, the GPIO signal may be transmitted by using the pin corresponding to the SCL signal, so as to implement the GPIO functions.

Step 904, after using the SOC pin corresponding to the SCL signal in the GPIO interface mode, the SOC pin is configured to be used in the I2C bus interface mode according to the process of using the SOC pin as the I2C bus interface, and the SOC pin corresponding to the SDA signal is configured to be used in the I2C bus interface mode, so as to perform a next I2C bus operation.

In this step, when the SOC pin corresponding to the SDA signal is recovered to be used in the I2C bus interface mode, it may be performed according to the following sequence: making the I2C bus interface pin pull-up resistor enable unit enable (i.e. make the pull-up resistor be connected with the power supply) firstly; and then making the GPIO output enable unit un-enable (i.e. output a low level).

In a method for using pins in different modes during different time provided by another embodiment of the present invention, the SOC may have the characteristics of the SOC in the second embodiment of the present invention. The method includes the following steps.

After configuring a pin corresponding to a SDA signal and a pin corresponding to a SCL signal to be used in an I2C bus interface mode, the two pins are configured to be in idle states, i.e. a high level state.

The SOC pin corresponding to the SCL signal is made to output a low level.

The SOC pin corresponding to the SDA signal is configured as the GPIO interface mode according to a process of using the SOC pin as the GPIO interface, so as to implement GPIO functions.

After using the SOC pin corresponding to the SDA signal in the GPIO interface mode, the SOC pin is configured to be used in the I2C bus interface mode according to the process of using the SOC pin as the I2C bus interface, and the SOC pin corresponding to the SCL signal is configured to be in a signal transmission state to perform a next I2C bus operation.

In a method for using pins in different modes during different time provided by another embodiment of the present invention, the SOC may have the characteristics of the SOC in the third embodiment of the present invention. The method includes the following steps.

After configuring a pin corresponding to a SDA signal and a pin corresponding to a SCL signal to be used in an I2C bus interface mode, the two pins are configured to be in idle states, i.e. a high level state.

The SOC pin corresponding to the SDA signal is made to output a low level.

The SOC pin corresponding to the SCL signal is configured to be used in the GPIO interface mode according to a process of using the SOC pin as the GPIO interface to implement GPIO functions.

After using the SOC pin corresponding to the SCL signal in the GPIO interface mode, the SOC pin is configured to be used in the I2C bus interface mode according to the process of using the SOC pin as the I2C bus interface, and the SOC pin corresponding to the SDA signal is configured to be in an I2C signal transmission state, so as to perform a next I2C bus operation.

It is possible that the data transmission of the I2C bus interface causes misacting of the GPIO, but the GPIO is usually used as a chip selecting signal for external storage devices, or an enable signal for external display devices etc. in the SOC, the GPIO needs to cooperate with other multiple signals to cause the misacting of the external devices of the GPIO, hence the possibility of causing the misacting is not high, and is not discussed in the present invention.

In view of the foregoing, along with the more complicated functions of the SOC, the number of interface modes of the SOC pins becomes large, and how to reduce the number of the SOC pins to a larger extent under the same interface function is more and more important for design of the SOC. The circuits and methods provided by the embodiments of the present invention can use one SOC pin in multiple interface modes to achieve functions of implementing different interface modes during different time, so as to reduce the number of SOC pins and make it possible to reduce the encapsulation of the SOC. Therefore, the design of the SOC is more easily and flexible.

Therefore, the circuits and methods provided by the embodiments of the present invention not only effectively reduces production costs and improves production yield, but also provide more flexible SOC and applications of the SOC.

The above embodiments further illustrate in detail the purpose, solutions and merit more of the present invention. It should be noted that the foregoing are only preferred embodiments of the present invention and are not for use in limiting the protection scope of the present invention. Any modification, equivalent replacement and improvement made within the scope of the present invention should be covered under the protection scope of the present invention.

The invention claimed is:

1. A System-On-a-Chip (SOC), wherein at least one pin of the SOC is used in a first interface mode or a second interface mode during different time; the SOC comprises a first interface circuit, a first pin, a second interface circuit and a second pin;
   the first interface circuit comprises a first bidirectional PAD unit, a first signal interface unit of the first interface mode, an output port of the first bidirectional PAD unit is connected with the first pin;
   the second interface circuit comprises a second bidirectional PAD unit, a second signal interface unit of the first interface mode, the second signal interface unit of the first interface mode is connected with the second pin through the second bidirectional PAD unit;
   the first interface circuit further comprises a selecting unit and an interface unit of the second interface mode; the selecting unit is used to select an output of the first signal interface unit of the first interface mode or an output of the interface unit of the second interface mode during different time, and the the selected output is connected with an input port of the first bidirectional PAD unit.

2. The SOC of claim 1, wherein the first bidirectional PAD unit comprises a pull-up resistor and a switch unit; one side of the pull-up resistor is connected with an output port of the first bidirectional PAD unit, the other side of the pull-up resistor is connected with a power supply through the switch unit;
   when the switch unit is closed, the selecting unit is adapted to connect the output of the first signal interface unit of the first interface mode with an input port of the first bidirectional PAD unit;
   when the switch unit is open, the selecting unit is adapted to connect the output of the interface unit of the second interface mode with an input port of the first bidirectional PAD unit.

3. The SOC of claim 2, wherein the first signal interface unit of the first interface mode comprises a first signal output unit and a first signal input unit; the interface unit of the second interface mode comprises a second interface mode output enable unit, a second interface mode signal output unit and a second interface mode signal input unit; the selecting unit comprises a first selector and a second selector; the output port of the first bidirectional PDA unit comprises a second port, a third port and a fourth port;
   an output of the second interface mode output enable unit is connected with one input of the first selector, an output of the first signal output unit is connected with the other input of the first selector after inversed by a reverser; an output of the first selector is connected with the second port;
   an output of the second interface mode signal output unit is connected with one input of the second selector, the other input of the second selector is grounded, an output of the second selector is connected with the third port; an input of the second interface mode signal input unit and an input of the first signal input unit are both connected with the fourth port.

4. The SOC of claim 3, wherein the first bidirectional PDA unit comprises a buffer and a three-state buffer;
   an input of the buffer is connected with an output port of the first bidirectional PDA unit, and an output of the buffer is connected with the fourth port;
   an input of the three-state buffer is connected with the third port, an control port of the three-state buffer is connected with the second port, and an output is connected with the output port of the first bidirectional PDA unit.

5. The SOC of claim 1, wherein the second signal interface unit of the first interface mode is connected with the second pin through the second bidirectional PAD unit comprises:
   the output of the second signal interface unit of the first interface mode is connected with an input port of the second bidirectional PAD unit, and an output port of the second bidirectional PAD unit is connected with the second pin.

6. The SOC of claim 1, further comprising a selecting unit between the second signal interface unit of the first interface mode and the second bidirectional PAD unit; wherein the second signal interface unit of the first interface mode is connected with the second pin through the second bidirectional PAD unit comprises:
   the output of the second signal interface unit of the first interface mode is connected with an input of the selecting unit, an output of the selecting unit is connected with an input port of the second bidirectional PAD unit, and an output port of the second bidirectional PAD unit is connected with the second pin.

7. The SOC of claim 2, wherein the first interface mode is an Inter-Integrated Circuit mode, the second interface mode is a General Purpose Input/Output mode.

8. The SOC of claim 7, wherein the first signal is a Serial Data (SDA) signal, and the second signal is a Serial Clock (SCL) signal.

9. The SOC of claim 7, wherein the first signal is a Serial Clock (SCL) signal, and the second signal is a Serial Data (SDA) signal.

10. A method for using pins in different mode during different time, being able to make at least one pin of a System-On-a-Chip (SOC) be used in a first interface mode or a second interface mode during different time; wherein the SOC comprises a first interface circuit, a first pin, a second interface circuit, and a second pin; the first interface circuit comprises a first bidirectional PAD unit, a first signal interface unit of the first interface mode and a interface unit of the second interface mode; the second interface circuit comprises a second bidirectional PAD unit, a second signal interface unit of the first interface mode; and the method comprises:
    connecting an output of the first signal interface unit of the first interface mode or an output of the interface unit of the second interface mode with the first pin through the first bidirectional PAD unit during different time.

11. The method of claim 10, wherein the first bidirectional PAD unit comprises a pull-up resistor and a switch unit; one side of the pull-up resistor is connected with the first pin, the other side of the pull-up resistor is connected with a power supply through the switch unit;
    connecting the output of the first signal interface unit of the first interface mode or the output of the interface unit of the second interface mode with the first pin through the first bidirectional PAD unit during different time comprising: performing one of SA and SB during different time:

SA, controlling the switch unit to be closed, and connecting the output of the first signal interface unit of the first interface mode with the first pin through the first bidirectional PAD;

SB, controlling the switch unit to be open, and connecting the output of the interface unit of the second interface mode with the first pin through the first bidirectional PAD.

12. The method of claim 11, wherein the first signal is a Serial Data (SDA) signal, and the second signal is a Serial Clock (SCL) signal;

after controlling the switch unit to be closed, and connecting the output of the first signal interface unit of the first interface mode with the first pin through the first bidirectional PAD, the method further comprises:

making the second pin output a low level;

controlling the switch unit to be open, and connecting the output of the interface unit of the second interface mode with the first pin through the first bidirectional PAD.

13. The method of claim 11, wherein the first signal is a Serial Clock (SCL) signal, and the second signal is a Serial Data (SDA) signal;

after controlling the switch unit to be closed, and connecting the output of the first signal interface unit of the first interface mode with the first pin through the first bidirectional PAD, the method further comprises:

making the second pin output a high level;

controlling the switch unit to be open, and connecting the output of the interface unit of the second interface mode with the first pin through the first bidirectional PAD.

14. The method of claim 11, the first interface mode is an Inter-Integrated Circuit mode, and the second interface mode is a General Purpose Input/Output mode.

* * * * *